(12) United States Patent
Enoki et al.

(10) Patent No.: US 10,253,222 B2
(45) Date of Patent: Apr. 9, 2019

(54) ADHESIVE SHEET FOR WAFER PROTECTION

(71) Applicant: LINTEC CORPORATION, Itabashi-ku (JP)

(72) Inventors: Sayaka Enoki, Tokorozawa (JP); Yuki Morita, Munich (DE)

(73) Assignee: LINTEC CORPORATION, Itabashi-ku (JP)

(*) Notice: Subject to any disclaimer, the term of this patent is extended or adjusted under 35 U.S.C. 154(b) by 317 days.

(21) Appl. No.: 15/112,374

(22) PCT Filed: Dec. 3, 2014

(86) PCT No.: PCT/JP2014/082017
§ 371 (c)(1),
(2) Date: Jul. 18, 2016

(87) PCT Pub. No.: WO2015/111310
PCT Pub. Date: Jul. 30, 2015

(65) Prior Publication Data
US 2016/0333225 A1    Nov. 17, 2016

(30) Foreign Application Priority Data

Jan. 21, 2014 (JP) .................. 2014-008731

(51) Int. Cl.
| C09J 7/02 | (2006.01) |
| C09J 133/10 | (2006.01) |
| H01L 21/683 | (2006.01) |
| C09J 7/38 | (2018.01) |
| C09J 7/29 | (2018.01) |

(52) U.S. Cl.
CPC .............. C09J 133/10 (2013.01); C09J 7/29 (2018.01); C09J 7/385 (2018.01); H01L 21/6836 (2013.01); C09J 2203/326 (2013.01); C09J 2433/00 (2013.01); C09J 2433/006 (2013.01); H01L 2221/6834 (2013.01); H01L 2221/68327 (2013.01); H01L 2221/68381 (2013.01)

(58) Field of Classification Search
None
See application file for complete search history.

(56) References Cited

U.S. PATENT DOCUMENTS

| 2007/0054469 A1* | 3/2007 | Yano ........................ C09J 7/29 |
| | | 438/459 |
| 2007/0071969 A1* | 3/2007 | Kontani .................. B32B 27/40 |
| | | 428/343 |
| 2008/0248296 A1* | 10/2008 | Shintani ............... C09D 133/08 |
| | | 428/345 |
| 2010/0233868 A1* | 9/2010 | Maeda ................ H01L 21/6835 |
| | | 438/464 |

FOREIGN PATENT DOCUMENTS

| JP | 2004-331743 A | 11/2004 |
| JP | 2005-303068 A | 10/2005 |
| JP | 2007-84722 A | 4/2007 |
| JP | 2010-287819 A | 12/2010 |

OTHER PUBLICATIONS

Shintani, Toshiaki et al., "Pressure sensitive adhesive sheet for holding and protecting semiconductor wafer, and rear facing grinding method of semiconductor wafer", machine translation of JP 2005-303068A (Year: 2005).*
International Search Report dated Mar. 10, 2015, in PCT/JP2015/082017 filed Dec. 3, 2014.

* cited by examiner

*Primary Examiner* — Anish P Desai
(74) *Attorney, Agent, or Firm* — Oblon, McClelland, Maier & Neustadt, L.L.P.

(57) ABSTRACT

There is provided a pressure sensitive adhesive sheet for wafer protection (1a) comprising a base material (11), an intermediate layer (12), and a pressure sensitive adhesive layer (13) in this order, wherein the intermediate layer is a layer formed from an intermediate layer-forming composition containing 100 parts by mass of a non-energy ray-curable acrylic polymer (A) and 25 parts by mass or more of an energy ray-curable acrylic polymer (B) having a mass average molecular weight of 50,000 to 250,000; and the pressure sensitive adhesive layer is a layer formed from a pressure sensitive adhesive composition containing an energy ray-curable acrylic polymer (C). The inventive pressure sensitive adhesive sheet for wafer protection is excellent in interfacial adhesion between an intermediate layer and a pressure sensitive adhesive layer after energy ray irradiation. Therefore, the pressure sensitive adhesive sheet for wafer protection can suppress the deposition of a residue of the pressure sensitive adhesive layer to an adherend when it is removed after laminated to the adherend, has excellent followability even to an adherend having a large unevenness difference on a wafer surface, and has a small rate of change of adhesive strength even after being stored for a long period of time and has excellent stability with time.

20 Claims, 1 Drawing Sheet

(a)
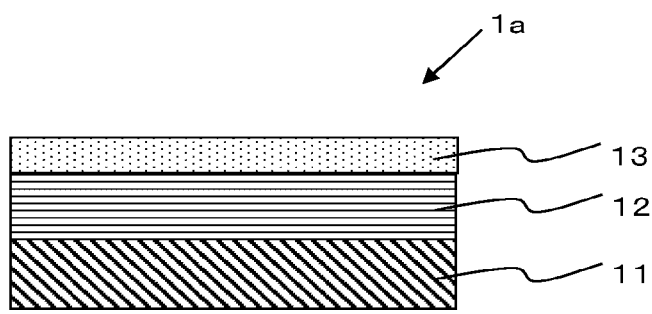
(b)
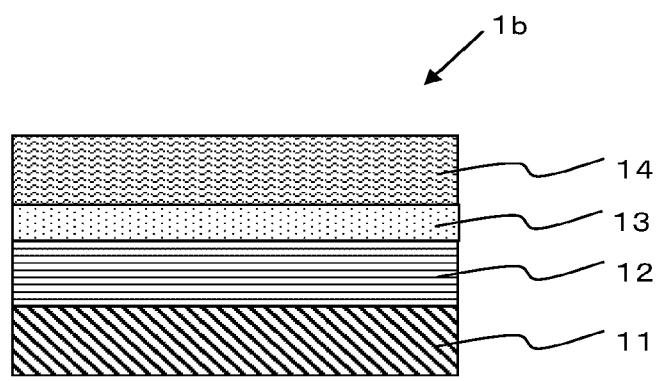

ADHESIVE SHEET FOR WAFER PROTECTION

TECHNICAL FIELD

The present invention relates to a pressure sensitive adhesive sheet for wafer protection which is suitable as a protective sheet laminated to a surface of the wafer in a polishing and grinding step of the wafer.

BACKGROUND ART

In recent years, the requirement for reduction in thickness and size of a semiconductor chip have become intensified with the higher integration of electronic equipment. When an extremely thin semiconductor chip is intended to be obtained and mounted on a device, there is employed a method of subjecting the surface opposite to a circuit pattern-forming surface having a bump and the like of a semiconductor wafer to polishing and grinding work before the semiconductor wafer is divided into chips and then subjecting the resulting semiconductor wafer to a dicing step of cutting it individual chips.

In order to prevent the circuit pattern surface of a semiconductor wafer from being damaged or being polluted with polishing waste, polishing water, and the like during such a step, it is necessary to protect the circuit pattern-forming surface of a semiconductor wafer.

Further, a semiconductor wafer has a problem of being easily damaged even with slight external force since it is thin and brittle by itself as well as the surface of a circuit pattern has unevenness.

For the purpose of protecting the circuit pattern surface and preventing the breakage of a semiconductor wafer during the processing of such a semiconductor wafer, there is known a method of laminating a back grinding sheet to the circuit pattern surface of a semiconductor wafer during polishing and grinding work.

Further, the followability to the unevenness of a circuit pattern-forming surface having a bump or the like of a semiconductor wafer is also required for such a pressure sensitive adhesive sheet.

When a pressure sensitive adhesive sheet having an insufficient followability to unevenness is used, the adhesion between the pressure sensitive adhesive layer of the pressure sensitive adhesive sheet and the surface of the semiconductor wafer will be insufficient. As a result, during the polishing work, there may be peeling of a pressure sensitive adhesive sheet, infiltration of polishing waste and polishing water into a pattern-forming surface, working failure, occurrence of dimples, occurrence of chip flying and the like, and even damage of a semiconductor wafer.

Various pressure sensitive adhesive sheets are proposed aiming at the development of a pressure sensitive adhesive sheet that can solve the above problems.

For example, for the purpose of providing a pressure sensitive adhesive sheet for holding and protecting a semiconductor wafer which can follow the unevenness of a wafer surface and can prevent wafer contamination and a wafer crack, Patent Document 1 discloses a pressure sensitive adhesive sheet in which there is provided, on one side of a base material layer, an intermediate layer having a predetermined modulus of elasticity and gel fraction and containing an acrylic polymer and a radiation curable oligomer, and a radiation curable pressure sensitive adhesive layer is formed on a surface of the intermediate layer.

CITATION LIST

Patent Literature

Patent Document 1: JP 2005-303068 A

SUMMARY OF INVENTION

Technical Problem

The pressure sensitive adhesive sheet described in Patent Document 1 has a structure in which the pressure sensitive adhesive layer is formed on the surface of the intermediate layer, but in order to improve the modulus of elasticity of the intermediate layer after radiation irradiation, the intermediate layer contains a radiation curable oligomer as a low-molecular component.

Incidentally, when the pressure sensitive adhesive sheet described in Patent Document 1 is stored for a long period of time, a part of the radiation curable oligomer as a low-molecular component contained in the intermediate layer of the pressure sensitive adhesive sheet tends to be transferred to the pressure sensitive adhesive layer. This may cause problems that the adhesive strength of the pressure sensitive adhesive layer becomes unstable, and that the pressure sensitive adhesive layer is excessively cured after energy ray irradiation. Therefore, the pressure sensitive adhesive sheet described in Patent Document 1 has a problem in terms of stability with time.

Note that when such a pressure sensitive adhesive sheet which is poor in stability with time is used after being stored for a long period of time, or when it is allowed to stand for a long period of time in the state in which it is laminated to an adherend, the interfacial adhesion between the intermediate layer and the pressure sensitive adhesive layer after energy ray irradiation tends to be insufficient. Therefore, when the pressure sensitive adhesive sheet after being allowed to stand for a long period of time is peeled, the pressure sensitive adhesive layer may be broken, or a residue of the pressure sensitive adhesive layer may deposit on the adherend.

An object of the present invention is to provide a pressure sensitive adhesive sheet for wafer protection which, since the inventive pressure sensitive adhesive sheet is excellent in interfacial adhesion between an intermediate layer and a pressure sensitive adhesive layer after energy ray irradiation, can suppress the deposition of a residue of the pressure sensitive adhesive layer on an adherend when it is removed after laminated to the adherend, has excellent followability even to an adherend having a large unevenness difference on a wafer surface, and has a small rate of change of adhesive strength even after stored for a long period of time and has excellent stability with time.

Solution to Problem

The present inventors have found that, with respect to the pressure sensitive adhesive sheet for wafer protection comprising a base material, an intermediate layer, and a pressure sensitive adhesive layer in this order, the above problems can be solved by using a layer formed from an intermediate layer-forming composition as the intermediate layer, the composition containing a non-energy ray-curable acrylic polymer and an energy ray-curable acrylic polymer having a specific mass average molecular weight in predetermined proportions, and have completed the present invention.

Specifically, the present invention provides the following [1] to [6].

[1] A pressure sensitive adhesive sheet for wafer protection comprising a base material, an intermediate layer, and a pressure sensitive adhesive layer in this order, wherein the intermediate layer is a layer formed from an intermediate layer-forming composition containing 100 parts by mass of a non-energy ray-curable acrylic polymer (A) and 25 parts by mass or more of an energy ray-curable acrylic polymer (B) having a mass average molecular weight of 50,000 to 250,000; and the pressure sensitive adhesive layer is a layer formed from a pressure sensitive adhesive composition containing an energy ray-curable acrylic polymer (C).

[2] The pressure sensitive adhesive sheet for wafer protection according to the above [1], wherein the mass average molecular weight of the component (A) is 300,000 to 1,500,000.

[3] The pressure sensitive adhesive sheet for wafer protection according to the above [1] or [2], wherein the content of the component (B) in the intermediate layer-forming composition is 37 parts by mass or more and 150 parts by mass or less based on 100 parts by mass of the component (A).

[4] The pressure sensitive adhesive sheet for wafer protection according to any one of the above [1] to [3], wherein the component (A) is an acrylic copolymer (A1) having a structural unit (a1) derived from an alkyl (meth)acrylate (a1') having an alkyl group having 1 to 18 carbon atoms and a structural unit (a2) derived from a functional group-containing monomer (a2').

[5] The pressure sensitive adhesive sheet for wafer protection according to any one of the above [1] to [4], wherein the component (B) is an energy ray-curable acrylic copolymer (B1) obtained by reacting a polymerizable compound (Xb) with an acrylic copolymer (B0) having a structural unit (b1) derived from an alkyl (meth)acrylate (b1') having an alkyl group having 1 to 18 carbon atoms and a structural unit (b2) derived from a functional group-containing monomer (b2').

[6] The pressure sensitive adhesive sheet for wafer protection according to any one of the above [1] to [5], wherein the component (C) is an energy ray-curable acrylic copolymer (C1) obtained by reacting a polymerizable compound (Xc) with an acrylic copolymer (C0) having a structural unit (c1) derived from an alkyl (meth)acrylate (c1') having an alkyl group having 1 to 18 carbon atoms and a structural unit (c2) derived from a functional group-containing monomer (c2').

Advantageous Effects of Invention

The pressure sensitive adhesive sheet for wafer protection of the present invention is excellent in interfacial adhesion between an intermediate layer and a pressure sensitive adhesive layer after energy ray irradiation. Therefore, the pressure sensitive adhesive sheet can suppress the deposition of a residue of the pressure sensitive adhesive layer on an adherend when it is removed after laminated to the adherend, has excellent followability even to an adherend having a large unevenness difference on a wafer surface, and has a small rate of change of adhesive strength even after stored for a long period of time and has excellent stability with time.

BRIEF DESCRIPTION OF DRAWING

FIG. 1 is a sectional view of a pressure sensitive adhesive sheet for wafer protection showing an example of the structure of the pressure sensitive adhesive sheet for wafer protection of the present invention.

DESCRIPTION OF EMBODIMENTS

In the following descriptions, "mass average molecular weight (Mw)" is a value in terms of polystyrene measured by a gel permeation chromatography (GPC) method, specifically a value measured based on the method described in Examples.

Further, for example, "(meth)acrylate" is used as a term meaning both "acrylate" and "methacrylate", which is the same for other similar terms.

Furthermore, in the present invention, "energy ray" means ultraviolet rays or electron rays, and ultraviolet rays are preferred.

[Structure of Pressure Sensitive Adhesive Sheet for Wafer Protection]

The pressure sensitive adhesive sheet for wafer protection of the present invention (hereinafter also simply referred to as "pressure sensitive adhesive sheet") is not particularly limited as long as the pressure sensitive adhesive sheet comprises a base material, an intermediate layer, and a pressure sensitive adhesive layer in this order.

FIG. 1 is a sectional view of a pressure sensitive adhesive sheet for wafer protection showing an example of the structure of the pressure sensitive adhesive sheet for wafer protection of the present invention.

Examples of the structure of the pressure sensitive adhesive sheet for wafer protection of the present invention include a pressure sensitive adhesive sheet for wafer protection 1a comprising a base material 11, an intermediate layer 12, and a pressure sensitive adhesive layer 13 in this order, as shown in FIG. 1(a); and a pressure sensitive adhesive sheet for wafer protection 1b which further has a release material 14 on the pressure sensitive adhesive layer 13, as shown in FIG. 1(b).

Note that the release material 14 in the pressure sensitive adhesive sheet for wafer protection 1b is removed when the sheet is laminated to a circuit pattern-forming surface of a semiconductor wafer.

Further, the pressure sensitive adhesive sheet for wafer protection according to one embodiment of the present invention may have a structure in which release treatment is applied to the surface of the base material 11 of the pressure sensitive adhesive sheet for wafer protection 1a opposite to the surface on which the intermediate layer 12 and the pressure sensitive adhesive layer 13 are laminated, and the pressure sensitive adhesive sheet for wafer protection 1a is wound in a rolled form.

Note that the pressure sensitive adhesive sheet for wafer protection according to one embodiment of the present invention may have a layer other than the above.

For example, in order to improve the interfacial adhesive force between the base material 11 and the intermediate layer 12, the pressure sensitive adhesive sheet for wafer protection may be provided with a primer layer between the base material 11 and the intermediate layer 12.

Examples of materials for forming the primer layer include a resin composition containing a thermosetting resin such as a phenol-based resin, an epoxy-based resin, a polyester-based resin, a urethane-based resin, and a silicone-based resin.

Further, the pressure sensitive adhesive sheet for wafer protection according to one embodiment of the present invention may be provided with an antistatic layer containing an antistatic agent between the base material 11 and the intermediate layers 12 or on the surface of the base material 11 opposite to the surface on which the intermediate layer 12 and the pressure sensitive adhesive layer 13 are provided.

Examples of the antistatic agent include cationic compounds such as a quaternary ammonium salt, a pyridinium salt, and primary to tertiary amino groups; anionic compounds such as a sulfonic acid salt group, a sulfuric ester salt group, a phosphate salt group, and a phosphonate group; amphoteric compounds such as an amino acid-based compound and an aminosulfate-based compound; and nonionic compounds such as an amino alcohol-based compound, a glycerin-based compound, and a polyethylene glycol-based compound.

<Base Material>

The base material in the pressure sensitive adhesive sheet for wafer protection according to one embodiment of the present invention is not particularly limited, but a resin film is preferred from the point of view of having a property that even when the pressure sensitive adhesive sheet for wafer protection is laminated to a wafer and the wafer is polished and ground to a ultra-thin thickness, the wafer can be stably held.

Examples of the resin film include a polyethylene film, a polypropylene film, a polybutene film, a polybutadiene film, a polymethylpentene film, a polyvinylchloride film, a vinyl chloride copolymer film, an ethylene-vinylacetate copolymer (EVA) film, a polyethylene terephthalate film, a polyethylene naphthalate film, a polybutylene terephthalate film, an ethylene-(meth)acrylic acid copolymer film, an ethylene-(meth)acrylate copolymer film, a polycarbonate-based film, a polystyrene-based film, a polyphenylene sulfide-based film, a cycloolefin polymer-based film, a polyurethane-based film, an ionomer resin film, a polyimide-based film, and a fluororesin film.

Note that the base material used in one embodiment of the present invention may be a resin film containing only one of the resins described above or may be a resin film containing two or more of the resins described above.

Note that the base material used in one embodiment of the present invention may be a cross-linked film of these resin films.

Further, the resin film used in one embodiment of the present invention may be a single-layer film composed of one resin film or may be a multilayer film in which a plurality of resin films are laminated.

Among these resin films, a polyethylene film, a polypropylene film, an ethylene-vinylacetate copolymer (EVA) film, and a polyethylene terephthalate film are preferred, and an ethylene-vinylacetate copolymer (EVA) film is more preferred, from the point of view of having a property that even when the pressure sensitive adhesive sheet for wafer protection is laminated to a wafer and the wafer is polished and ground to a ultra-thin thickness, the wafer can be stably held.

Note that the resin film described above may contain a known filler, coloring agent, antistatic agent, antioxidant, organic lubricant, catalyst or the like.

Further, the resin film may be transparent or optionally colored or vapor-deposited with a metal or the like.

The thickness of the base material is preferably 10 to 500 µm, more preferably 15 to 300 µm, further preferably 20 to 200 µm.

When the thickness of the base material is 10 µm or more, the base material is excellent in deformation resistance (dimensional stability) at high temperatures. On the other hand, when the thickness of the base material is 500 µm or less, deformation of the pressure sensitive adhesive sheet for wafer protection by the vibration during polishing work can be suppressed when the pressure sensitive adhesive sheet for wafer protection is laminated to a wafer and the back surface of the wafer is polished.

Note that in the present invention, the "thickness of the base material" represents the total thickness that constitutes the base material. For example, with respect to a base material in which a plurality of resin films are laminated, the sum of the thicknesses of the "plurality of resin films" is the thickness of the base material.

<Intermediate Layer>

The intermediate layer in the pressure sensitive adhesive sheet for wafer protection of the present invention is a layer formed from an intermediate layer-forming composition containing 100 parts by mass of a non-energy ray-curable acrylic polymer (A) and 25 parts by mass or more of an energy ray-curable acrylic polymer (B) having a mass average molecular weight of 50,000 to 250,000.

Since the pressure sensitive adhesive sheet for wafer protection is excellent in followability to an adherend having a large unevenness difference by providing the intermediate layer, when a wafer to which the pressure sensitive adhesive sheet for wafer protection is laminated is polished and ground, breakage of the wafer and infiltration of grinding waste and grinding water can be prevented.

The thickness of the intermediate layer is arbitrarily selected by the height of a bump in a semiconductor wafer serving as an adherend, and it is preferably 10 to 800 µm, more preferably 15 to 600 µm, further preferably 20 to 400 µm.

When the thickness of the intermediate layer is 10 µm or more, the followability to an adherend having a large unevenness difference can be satisfactory. On the other hand, when the thickness of the intermediate layer is 800 µm or less, the deformation of the pressure sensitive adhesive sheet of the present invention can be suppressed.

The intermediate layer-forming composition as a material for forming the intermediate layer contains 100 parts by mass of a non-energy ray-curable acrylic polymer (A) (hereinafter also referred to as "acrylic polymer (A)" or "component (A)") and 25 parts by mass or more of an energy ray-curable acrylic polymer (B) having a mass average molecular weight of 50,000 to 250,000 (hereinafter also referred to as "acrylic polymer (B)" or "component (B)").

If the content of the component (B) is less than 25 parts by mass, the interfacial adhesion between the intermediate layer and the pressure sensitive adhesive layer of the pressure sensitive adhesive sheet for wafer protection after energy ray irradiation will be insufficient. Therefore, when the pressure sensitive adhesive sheet having the intermediate layer formed is peeled from an adherend, the pressure sensitive adhesive layer tends to be broken, or a residue of the pressure sensitive adhesive layer tends to deposit on a semiconductor wafer.

The content of the component (B) in the intermediate layer-forming composition is 25 parts by mass or more based on 100 parts by mass of the component (A). However, the content is preferably 30 parts by mass or more, more preferably 37 parts by mass or more, further preferably 40 parts by mass or more, from the point of view of forming an intermediate layer which can improve the interfacial adhesion between the intermediate layer and the pressure sensitive adhesive layer after energy ray irradiation Further, the content of the component (B) in the intermediate layer-forming composition is preferably 150 parts by mass or less, more preferably 140 parts by mass or less, further preferably 130 parts by mass or less, based on 100 parts by mass of the component (A), from the point of view of suppressing the bleeding of a part of the intermediate layer from an end of the pressure sensitive adhesive sheet for wafer protection according to one embodiment of the present invention.

The total content of the component (A) and the component (B) in the intermediate layer-forming composition is preferably 70% by mass or more, more preferably 80% by mass or more, further preferably 90% by mass or more, and preferably 98.0% by mass or less, based on the total amount (100% by mass) of the intermediate layer-forming composition.

Note that the intermediate layer-forming composition preferably further contains a photopolymerization initiator and a cross-linking agent in addition to the component (A) and the component (B). Further, the composition may also contain additives other than the above.

Hereinafter, each component contained in the intermediate layer-forming composition will be described.

[Component (A): Non-Energy Ray-Curable Acrylic Polymer (A)]

Examples of the non-energy ray-curable acrylic polymer (A) include a polymer having a structural unit derived from an alkyl (meth)acrylate having a linear of branched alkyl group and a polymer having a structural unit derived from a (meth)acrylate having a cyclic structure.

The mass average molecular weight (Mw) of the component (A) is preferably 300,000 to 1,500,000, more preferably 350,000 to 1,300,000, more preferably 400,000 to 1,200,000, further preferably 400,000 to 1,100,000, further more preferably 450,000 to 900,000.

The component (A) preferably includes an acrylic copolymer (A1) having a structural unit (a1) derived from an alkyl(meth)acrylate (a1') having an alkyl group having 1 to 18 carbon atoms (hereinafter also referred to as "monomer (a1')") and a structural unit (a2) derived from a functional group-containing monomer (a2') (hereinafter also referred to as "monomer (a2')"), from the point of view of compatibility with the component (B); and the component (A) is preferably the acrylic copolymer (A1).

Note that the copolymerization form of the acrylic copolymer (A1) is not particularly limited, and the copolymer may be any of a block copolymer, a random copolymer, and a graft copolymer.

The content of the acrylic copolymer (A1) is preferably 70 to 100% by mass, more preferably 80 to 100% by mass, further preferably 90 to 100% by mass, further more preferably 100% by mass, based on the total amount (100% by mass) of the component (A) contained in the intermediate layer-forming composition.

The number of carbon atoms of the alkyl group in the monomer (a1') is more preferably 4 to 12, further preferably 4 to 8, further more preferably 4 to 6, from the point of view of compatibility with the component (B).

Examples of the monomer (a1') include methyl (meth)acrylate, ethyl (meth)acrylate, propyl (meth)acrylate, butyl (meth)acrylate, 2-ethylhexyl (meth)acrylate, lauryl (meth)acrylate, tridecyl (meth)acrylate, and stearyl (meth)acrylate.

Among these, butyl (meth)acrylate and 2-ethylhexyl (meth)acrylate are preferred, and butyl (meth)acrylate is more preferred.

The content of the structural unit (a1) in the acrylic copolymer (A1) is preferably 50 to 99.5% by mass, more preferably 60 to 99% by mass, further preferably 70 to 95% by mass, further more preferably 80 to 93% by mass, based on the total structural units (100% by mass) of the acrylic copolymer (A1).

When the content of the structural unit (a1) is 50% by mass or more, a pressure sensitive adhesive sheet having good followability to an adherend having a large unevenness difference can be obtained. Therefore, this content is preferred.

Further, when the content of the structural unit (a1) is 99.5% by mass or less, the content of the structural unit (a2) can be sufficiently secured, and the compatibility with the component (B) can be improved. Therefore, this content is preferred.

Further, the acrylic copolymer (A1) preferably has, as the structural unit (a1), a structural unit (a11) derived from an alkyl(meth)acrylate having an alkyl group having 4 or more (preferably 4 to 12, more preferably 4 to 8, further preferably 4 to 6) carbon atoms.

The content of the structural unit (a11) in the structural unit (a1) is preferably 60% by mass or more, more preferably 70% by mass or more, further preferably 80% by mass or more, further more preferably 85% by mass or more, and preferably 100% by mass or less, based on the total amount (100% by mass) of the structural unit (a1) in the acrylic copolymer (A1).

Examples of the functional group in the monomer (a2') include a hydroxy group, a carboxy group, an epoxy group, an amino group, a cyano group, a keto group, a nitrogen atom-containing ring group, and an alkoxy silyl group.

Further, specific examples of the monomer (a2') include a hydroxy group-containing monomer, a carboxy group-containing monomer, an epoxy group-containing monomer, an amino group-containing monomer, a cyano group-containing monomer, a keto group-containing monomer, a monomer having a nitrogen atom-containing ring, and an alkoxy silyl group-containing monomer.

Among these, one or more selected from a hydroxy group-containing monomer, a carboxy group-containing monomer, and an epoxy group-containing monomer are preferred, and a carboxy group-containing monomer is more preferred.

Examples of the hydroxy-containing monomer include hydroxyalkyl (meth)acrylates such as 2-hydroxyethyl (meth)acrylate, 2-hydroxypropyl (meth)acrylate, 3-hydroxypropyl (meth)acrylate, 2-hydroxybutyl (meth)acrylate, 3-hydroxybutyl (meth)acrylate, and 4-hydroxybutyl (meth)acrylate; and unsaturated alcohols such as vinyl alcohol and allyl alcohol.

Among these, 2-hydroxyethyl (meth)acrylate is preferred.

Examples of the carboxy group-containing monomer include (meth)acrylic acid, maleic acid, fumaric acid, and itaconic acid.

Among these, (meth)acrylic acid is preferred, and acrylic acid is more preferred.

Examples of the epoxy-containing monomer include epoxy group-containing (meth)acrylate and a non-acrylic epoxy group-containing monomer.

Examples of the epoxy group-containing (meth)acrylate include glycidyl (meth)acrylate, β-methylglycidyl (meth)acrylate, (3,4-epoxycyclohexyl)methyl (meth)acrylate, and 3-epoxycyclo-2-hydroxypropyl (meth)acrylate.

Further, examples of the non-acrylic epoxy group-containing monomer include glycidyl crotonate and allyl glycidyl ether.

The content of the structural unit (a2) in the acrylic copolymer (A1) is preferably 0.5 to 50% by mass, more preferably 1 to 40% by mass, further preferably 5 to 30% by mass, further more preferably 7 to 20% by mass, based on the total structural units (100% by mass) of the acrylic copolymer (A1).

When the content of the structural unit (a2) is 0.5% by mass or more, the compatibility with the component (B) can be improved. Therefore, this content is preferred.

Further, when the content of the structural unit (a2) is 50% by mass or less, a pressure sensitive adhesive sheet having good followability to an adherend having a large unevenness difference can be obtained. Therefore, this content is preferred.

The acrylic copolymer (A1) may have a structural unit (a3) derived from another monomer (a3') other than the above monomers (a1') and (a2').

Examples of another monomer (a3') include (meth)acrylates having a cyclic structure such as cyclohexyl (meth)acrylate, benzyl (meth)acrylate, isobornyl (meth)acrylate, dicyclopentanyl (meth)acrylate, dicyclopentenyl (meth)acrylate, dicyclopentenyloxyethyl (meth)acrylate, and imide (meth)acrylate, vinyl acetate, acrylonitrile, and styrene.

The content of the structural unit (a3) in the acrylic copolymer (A1) is preferably 0 to 30% by mass, more preferably 0 to 20% by mass, further preferably 0 to 10% by mass, further more preferably 0 to 5% by mass, based on the total structural units (100% by mass) of the acrylic copolymer (A1).

Note that each of the monomers (a1') to (a3') described above may be used singly or in combinations of two or more.

Examples of the synthetic method for manufacturing the component (A) include, but are not particularly limited to, a method of dissolving raw material monomers in a solvent and performing solution polymerization in the presence of a polymerization initiator, a chain transfer agent, and the like and a method of performing emulsion polymerization in an aqueous system using raw material monomers in the presence of an emulsifier, a polymerization initiator, a chain transfer agent, a dispersant, and the like.

Note that in these polymerization methods, additives such as a thickener, a wetting agent, a leveling agent, and a defoaming agent may be added as needed.

The polymerization reaction is preferably performed under a temperature condition of 60 to 100° C. for 2 to 8 hours.

The concentration of the raw material monomers during the polymerization is preferably 30 to 70% by mass, more preferably 40 to 60% by mass.

Examples of the polymerization initiator used in the polymerization include persulfates such as potassium persulfate and ammonium persulfate, azo compounds such as 2,2'-azobisisobutyronitrile and 2,2'-azobis(2,4-dimethylvaleronitrile), peroxides such as hydrogen peroxide, benzoyl peroxide, and lauryl peroxide, and redox polymerization initiators composed of a combination of sodium sulfite, sodium bisulfite, and the like with ammonium persulfate.

The amount of the polymerization initiator added is preferably 0.2 to 2 parts by mass, more preferably 0.3 to 1 part by mass based on 100 parts by mass of the total raw material monomers.

Examples of the chain transfer agent used in the polymerization include alkyl mercaptans such as octyl mercaptan, nonyl mercaptan, decyl mercaptan, and dodecyl mercaptan, thioglycolates such as octyl thioglycolate, nonyl thioglycolate, 2-ethylhexyl thioglycolate, and 2-ethylhexyl ft mercaptopropionate, 2,4-diphenyl-4-methyl-1-pentene, and 1-methyl-4-isopropylidene-1-cyclohexene.

Among these, thioglycolates, 2,4-diphenyl-4-methyl-1-pentene, and 1-methyl-4-isopropylidene-1-cyclohexene are preferred.

The amount of the chain transfer agent added is preferably 0.001 to 3 parts by mass based on 100 parts by mass of the total raw material monomers.

[Component (B): Energy Ray-Curable Acrylic Polymer (B)]

The energy ray-curable acrylic polymer (B) is an acrylic polymer in which an energy ray-polymerizable group is introduced into a non-energy ray-curable acrylic polymer.

Note that the energy ray-polymerizable group may be introduced into a main chain or a side chain of the non-energy ray-curable acrylic polymer.

The component (B) contained in the intermediate layer probably improves the interfacial adhesion between the intermediate layer and the pressure sensitive adhesive layer of the pressure sensitive adhesive sheet for wafer protection because when the sheet is irradiated with an energy ray, the component (B) and the component (C) in the pressure sensitive adhesive layer react to be bonded to each other. As a result, there can be obtained a pressure sensitive adhesive sheet for wafer protection which can suppress the deposition of a residue of the pressure sensitive adhesive layer on an adherend when the sheet is peeled.

Examples of the non-energy ray-curable acrylic polymer include an acrylic polymer having a structural unit derived from an alkyl (meth)acrylate having a linear of branched alkyl group and an acrylic polymer having a structural unit derived from a (meth)acrylate having a cyclic structure.

The energy ray-polymerizable group may be a group having an energy ray-polymerizable carbon-carbon double bond. Examples thereof include a (meth)acryloyl group and a vinyl group, and a (meth)acryloyl group is preferred from the point of view that the introduction of an energy ray-polymerizable group is easy.

Note that the energy ray-polymerizable group may be bonded to a main chain or a side chain of the non-energy ray-curable acrylic polymer through an alkylene group, an alkyleneoxy group, a polyalkyleneoxy group, or the like.

The mass average molecular weight (Mw) of the component (B) is 50,000 to 250,000, preferably 60,000 to 220,000, more preferably 70,000 to 200,000, further preferably 80,000 to 180,000, further more preferably 85,000 to 150,000.

If Mw of the component (B) is less than 50,000, the stability with time of the resulting pressure sensitive adhesive sheet for wafer protection will be poor. That is, when the pressure sensitive adhesive sheet is stored for a long period of time, a part of the component (B) will transfer to the pressure sensitive adhesive layer. As a result, the adhesive strength of the pressure sensitive adhesive sheet may be unstable, and the pressure sensitive adhesive layer may be excessively cured after energy ray irradiation. As a result, when the pressure sensitive adhesive sheet is used after being stored for a long period of time, or when it is allowed to stand for a long period of time in the state in which it is laminated to an adherend, the interfacial adhesion between the intermediate layer and the pressure sensitive adhesive layer after energy ray irradiation will be insufficient. Therefore, when the pressure sensitive adhesive sheet is peeled, the pressure sensitive adhesive layer may be broken, or a residue of the pressure sensitive adhesive layer may deposit on the adherend.

On the other hand, if Mw of the component (B) exceeds 250,000, the interfacial adhesion between the intermediate layer and the pressure sensitive adhesive layer after energy ray irradiation will be poor. Therefore, when the pressure sensitive adhesive sheet for wafer protection is peeled, the pressure sensitive adhesive layer may be broken, or a residue of the pressure sensitive adhesive layer may deposit on a wafer as an adherend.

The component (B) preferably includes an energy ray-curable acrylic copolymer (B1) obtained by reacting a polymerizable compound (Xb) with an acrylic copolymer (B0) having a structural unit (b1) derived from an alkyl (meth)acrylate (b1') having an alkyl group having 1 to 18 carbon atoms (hereinafter also referred to as "monomer (b1')") and a structural unit (b2) derived from a functional group-containing monomer (b2') (hereinafter also referred to as "monomer (b2')"), from the point of view of obtaining a pressure sensitive adhesive sheet which is excellent in stability with time and in which the interfacial adhesion after energy ray irradiation between the intermediate layer and the pressure sensitive adhesive layer to be formed is improved; and the component (B) is preferably the energy ray-curable acrylic copolymer (B1).

Note that the copolymerization form of the acrylic copolymers (B0) and (B1) is not particularly limited, and the copolymers may be any of a block copolymer, a random copolymer, and a graft copolymer.

The content of the acrylic copolymer (B1) is preferably 70 to 100% by mass, more preferably 80 to 100% by mass, further preferably 90 to 100% by mass, further more preferably 100% by mass, based on the total amount (100% by mass) of the component (B) contained in the intermediate layer-forming composition.

The number of carbon atoms of the alkyl group in the monomer (b1') is more preferably 4 to 12, further preferably 4 to 8, further more preferably 4 to 6.

Examples of the monomer (b19 include those illustrated as the monomer (a1') described above. Among these, butyl (meth)acrylate or 2-ethylhexyl (meth)acrylate is preferred, and butyl (meth)acrylate is more preferred.

The content of the structural unit (b1) in the acrylic copolymer (B0) is preferably 50 to 99% by mass, more preferably 55 to 95% by mass, further preferably 60 to 90% by mass, further more preferably 65 to 85% by mass, based on the total structural units (100% by mass) of the acrylic copolymer (B0).

When the content of the structural unit (b1) is 50% by mass or more, the shape of the intermediate layer to be formed can be sufficiently maintained. Therefore, this content is preferred.

Further, when the content of the structural unit (b1) is 99% by mass or less, the content of the structural unit (b2) having a functional group serving as a reactive site with the polymerizable compound (Xb) can be sufficiently secured, and the interfacial adhesion after energy ray irradiation between the intermediate layer and the pressure sensitive adhesive layer to be formed can be improved. Therefore, this content is preferred.

Examples of the monomer (b2') include those illustrated as the monomer (a2') described above, in which one or more selected from the group consisting of a hydroxy group-containing monomer, a carboxy group-containing monomer, and an epoxy group-containing monomer are preferred; a hydroxy group-containing monomer is more preferred; a hydroxy acrylic (meth)acrylate is further preferred; and 2-hydroxyethyl (meth)acrylate is further more preferred.

The content of the structural unit (b2) in the acrylic copolymer (B0) is preferably 1 to 50% by mass, more preferably 5 to 45% by mass, further preferably 10 to 40% by mass, further more preferably 15 to 35% by mass, based on the total structural units (100% by mass) of the acrylic copolymer (B0).

When the content of the structural unit (b2) is 1% by mass or more, it will be possible to secure the reactive sites with the polymerizable compound (Xb) sufficient for improving the interfacial adhesion after energy ray irradiation between the intermediate layer and the pressure sensitive adhesive layer to be formed. Therefore, this content is preferred.

Further, when the content of the structural unit (b2) is 50% by mass or less, the shape of the intermediate layer to be formed can be sufficiently maintained. Therefore, this content is preferred.

The acrylic copolymer (B0) may have a structural unit (b3) derived from another monomer (b3') other than the above monomers (b1') and (b2').

Examples of another monomer (b3') include those illustrated as the monomer (a3') described above.

The content of the structural unit (b3) in the acrylic copolymer (B0) is preferably 0 to 30% by mass, more preferably 0 to 20% by mass, further preferably 0 to 10% by mass, further more preferably 0 to 5% by mass, based on the total structural units (100% by mass) of the acrylic copolymer (B0).

Note that each of the monomers (b1') to (b3') described above may be used singly or in combinations of two or more.

Note that the acrylic copolymer (B0) can be synthesized by the same method as that for synthesizing the component (A) described above.

The energy ray-curable acrylic copolymer (B1) is obtained by the reaction of a polymerizable compound (Xb) with a functional group in the structural unit (b2) of the above acrylic copolymer (B0), wherein the energy ray-polymerizable group in the polymerizable compound (Xb) is introduced into at least one of a main chain and a side chain of the acrylic copolymer (B0).

The polymerizable compound (Xb) is not particularly limited as long as it is a compound having an energy ray-polymerizable group and a substituent that can react with a functional group in the structural unit (b2) of the acrylic copolymer (B0) (hereinafter also referred to simply as "reactive substituent").

Note that the polymerizable compound (Xb) preferably has the above reactive substituent and 1 to 5 energy ray-polymerizable groups per molecule.

Examples of the above reactive substituent include an isocyanate group, a carboxyl group, and an epoxy group, and an isocyanate group is preferred.

As described above, examples of the above energy ray-polymerizable group include a (meth)acryloyl group and a vinyl group, and a (meth)acryloyl group is preferred.

Specific examples of the polymerizable compound (Xb) include (meth)acryloyloxy ethyl isocyanate, meta-isopropenyl-α,α-dimethylbenzyl isocyanate, (meth)acryloyl isocyanate, allyl isocyanate, glycidyl (meth)acrylate, and (meth)acrylic acid.

These polymerizable compounds (Xb) may be used singly or in combinations of two or more.

Among these, (meth)acryloyloxy ethyl isocyanate is preferred from the point of view that the compound has an isocyanate group suitable as the above reactive substituent, and has a suitable distance between the acrylic copolymer (B0) and the energy ray-polymerizable group.

Examples of the synthetic method of the acrylic copolymer (B1) include a method in which, when the polymerizable compound (Xb) having an isocyanate group is introduced into the acrylic copolymer (B0), the polymerizable compound (Xb) having an isocyanate group is allowed to react with the acrylic copolymer (B0) in an organic solution such as ethyl acetate using a catalyst such as dibutyltin laurate in an environment of room temperature (25° C.) and normal pressure for about 10 to 30 hours.

The amount of the polymerizable compound (Xb) blended in the synthesis of the acrylic copolymer (B1) is preferably 20 to 100 equivalents, more preferably 30 to 95 equivalents, further preferably 40 to 90 equivalents, further more preferably 55 to 85 equivalents, based on 100 equivalents of the total number of functional groups in the acrylic copolymer (B0).

In the acrylic copolymer (B1), with respect to the relationship between the number of functional groups in the acrylic copolymer (B0) and the amount of the polymerizable compound (Xb) blended, the value of α calculated from the following formula (1) is preferably 1 to 50, more preferably 2 to 40, further preferably 3 to 35, further more preferably 5 to 30, from the point of view of improving the interfacial adhesion after energy ray irradiation between the intermediate layer and the pressure sensitive adhesive layer to be formed.

Note that the above value of a corresponds to the number of energy ray-polymerizable groups in the acrylic copolymer (B1).

$$\alpha = [P_b] \times [Q_b] \times [R_b]/100 \qquad \text{Formula (1)}$$

wherein $[P_b]$ represents the content of the structural unit (b2) based on 100 parts by mass of total structural units of the acrylic copolymer (B0); $[Q_b]$ represents the equivalent of the polymerizable compound (Xb) based on 100 equivalents of functional groups derived from the functional group-containing monomer in the acrylic copolymer (B0); and $[R_b]$ represents the number of the energy ray-polymerizable groups in the polymerizable compound (Xb).

[Cross-Linking Agent]

The intermediate layer-forming composition preferably further contains a cross-linking agent.

Examples of the cross-linking agent include isocyanate-based cross-linking agents such as tolylene diisocyanate, hexamethylene diisocyanate, and adducts thereof, epoxy-based cross-linking agents such as ethylene glycol glycidyl ether; aziridine-based cross-linking agents such as hexa[1-(2-methyl)-aziridinyl]triphosphatriazine; and chelate-based crosslinking agents such as aluminum chelate. These cross-linking agents may be used singly or in combinations of two or more.

Among these, an isocyanate-based cross-linking agent is preferred.

The content of the cross-linking agent is preferably 0.01 to 10 parts by mass, more preferably 0.1 to 7 parts by mass, further preferably 0.5 to 5 parts by mass, based on 100 parts by mass of the component (A).

[Photopolymerization Initiator]

The intermediate layer-forming composition preferably further contains a photopolymerization initiator.

Examples of the photopolymerization initiator include 1-hydroxy-cyclohexyl-phenyl-ketone, benzoin, benzoin methyl ether, benzoin ethyl ether, benzoin propyl ether, benzylphenyl sulfide, tetramethylthiuram monosulfide, azobisisobutyronitrile, dibenzyl, diacetyl, and 8-chloroanthraquinone.

These photopolymerization initiators may be used singly or in combinations of two or more.

The content of the photopolymerization initiator is preferably 0.01 to 15 parts by mass, more preferably 0.1 to 10 parts by mass, further preferably 0.5 to 7 parts by mass, based on 100 parts by mass of the component (A).

[Other Additives Contained in Intermediate Layer-Forming Composition]

The intermediate layer-forming composition may contain other additives in the range that does not impair the effects of the present invention.

Examples of other additives include an antioxidant, a softener (plasticizer), a filler, a rust preventive agent, a pigment, a dye, and a tackifier.

When the composition contains these additives, the content of each additive is preferably 0.01 to 6 parts by mass, more preferably 0.01 to 2 parts by mass, based on 100 parts by mass of the component (A).

Note that the intermediate layer-forming composition may be further diluted with an organic solvent into the form of a solution of the intermediate layer-forming composition from the point of view of improving coating properties when an intermediate layer is formed on the surface of a base material or a release material.

Examples of the organic solvent include methyl ethyl ketone, acetone, ethyl acetate, tetrahydrofuran, dioxane, cyclohexane, n-hexane, toluene, xylene, n-propanol, and isopropanol.

Note that, as the organic solvent to be used, an organic solvent used in the synthesis of the component (A) and the component (B) may be used as it is, or one or more organic solvents other than the organic solvent used in the synthesis may be added thereto.

When the intermediate layer-forming composition is converted into the form of a solution, the solid concentration of the solution of the intermediate layer-forming composition is preferably 5 to 70% by mass, more preferably 10 to 60% by mass, further preferably 15 to 50% by mass.

<Pressure Sensitive Adhesive Layer>

The pressure sensitive adhesive layer in the pressure sensitive adhesive sheet for wafer protection of the present invention is a layer formed from a pressure sensitive adhesive composition containing an energy ray-curable acrylic polymer (C) (hereinafter also referred to as "acrylic polymer (C)" or "component (C)").

The pressure sensitive adhesive sheet for wafer protection provided with the pressure sensitive adhesive layer has excellent adhesive strength that can sufficiently hold a wafer as an adherend before energy ray irradiation, but after energy ray irradiation, the adhesive strength is reduced, and the sheet can be easily peeled from the wafer as an adherend.

Further, when the sheet is irradiated with an energy ray, the component (B) in the intermediate layer and the component (C) in the pressure sensitive adhesive layer react to be bonded to each other in the interface of the pressure sensitive adhesive layer and the intermediate layer, which probably improves the interfacial adhesion between the intermediate layer and the pressure sensitive adhesive layer. Therefore, there can be obtained a pressure sensitive adhesive sheet for wafer protection that can suppress the deposition of a residue of the pressure sensitive adhesive layer on an adherend when the sheet is laminated to the adherend and then removed therefrom.

The content of the component (C) in the pressure sensitive adhesive composition is preferably 70% by mass or more, more preferably 80% by mass or more, further preferably 90% by mass or more, and preferably 99.9% by mass or less, more preferably 99.0% by mass or less, further preferably 98.0% by mass or less, based on the total amount (100% by mass) of the pressure sensitive adhesive composition.

The thickness of the pressure sensitive adhesive layer is preferably 1 to 100 more preferably 1 to 75 further preferably 1 to 50 μm, from the point of view of obtaining a pressure sensitive adhesive sheet for wafer protection having good adhesive strength and good followability to an adherend having a large unevenness difference.

The pressure sensitive adhesive composition which is a material that forms a pressure sensitive adhesive layer contains an energy ray-curable acrylic polymer (C), but the composition preferably further contains a cross-linking agent and a photopolymerization initiator. Further, the composition may contain additives other than the above.

Hereinafter, each component contained in the pressure sensitive adhesive composition will be described.

[Component (C): Energy Ray-Curable Acrylic Polymer (C)]

The energy ray-curable acrylic polymer (C) is an acrylic polymer in which an energy ray-polymerizable group is introduced into a non-energy ray-curable acrylic polymer.

Note that the energy ray-polymerizable group may be introduced into a main chain or a side chain of the non-energy ray-curable acrylic polymer.

Examples of the non-energy ray-curable acrylic polymer include an acrylic polymer having a structural unit derived from an alkyl (meth)acrylate having a linear of branched alkyl group and an acrylic polymer having a structural unit derived from a (meth)acrylate having a cyclic structure.

The energy ray-polymerizable group may be a group having an energy ray-polymerizable carbon-carbon double bond. Examples thereof include a (meth)acryloyl group and a vinyl group, and a (meth)acryloyl group is preferred from the point of view that the introduction of an energy ray-polymerizable group is easy.

Note that the energy ray-polymerizable group may be bonded to a main chain or a side chain of the non-energy ray-curable acrylic polymer through an alkylene group, an alkyleneoxy group, a polyalkyleneoxy group, or the like.

The mass average molecular weight (Mw) of the component (C) is preferably 100,000 to 1,500,000, more preferably 200,000 to 1,200,000, more preferably 250,000 to 1,000,000, further preferably 300,000 to 900,000, further more preferably 350,000 to 800,000.

The component (C) preferably includes an energy ray-curable acrylic copolymer (C1) obtained by reacting a polymerizable compound (Xc) with an acrylic copolymer (C0) having a structural unit (c1) derived from an alkyl (meth)acrylate (c1') having an alkyl group having 1 to 18 carbon atoms (hereinafter also referred to as "monomer (c1')") and a structural unit (c2) derived from a functional group-containing monomer (c2') (hereinafter also referred to as "monomer (c2')"), from the point of view of obtaining a pressure sensitive adhesive sheet in which adhesive strength can be efficiently reduced by energy ray irradiation; and the component (C) is more preferably the energy ray-curable acrylic copolymer (C1).

Note that the copolymerization form of the acrylic copolymers (C0) and (C1) is not particularly limited, and the copolymers may be any of a block copolymer, a random copolymer, and a graft copolymer.

The content of the acrylic copolymer (C1) is preferably 70 to 100% by mass, more preferably 80 to 100% by mass, further preferably 90 to 100% by mass, further more preferably 100% by mass, based on the total amount (100% by mass) of the component (C) contained in the pressure sensitive adhesive composition.

The number of carbon atoms of the alkyl group in the monomer (c1') is preferably 1 to 18, more preferably 1 to 12, further preferably 1 to 8, further more preferably 1 to 6.

Examples of the monomer (c1') include those illustrated as the monomer (a1') described above. Among these, butyl (meth)acrylate or 2-ethylhexyl (meth)acrylate is preferred, and butyl (meth)acrylate is more preferred.

The content of the structural unit (c1) in the acrylic copolymer (C0) is preferably 50 to 99.5% by mass, more preferably 60 to 99% by mass, further preferably 70 to 98% by mass, further more preferably 80 to 96% by mass, based on the total structural units (100% by mass) of the acrylic copolymer (C0), from the point of view of improving the adhesive strength of the pressure sensitive adhesive layer to be formed.

Examples of the monomer (c2') include those illustrated as the monomer (a2') described above, in which one or more selected from the group consisting of a hydroxy group-containing monomer, a carboxy group-containing monomer, and an epoxy group-containing monomer are preferred; a hydroxy group-containing monomer is more preferred; and 2-hydroxyethyl (meth)acrylate is further preferred.

The content of the structural unit (c2) in the acrylic copolymer (C0) is preferably 0.5 to 40% by mass, more preferably 1 to 30% by mass, further preferably 2 to 25% by mass, further more preferably 3 to 15% by mass, based on the total structural units (100% by mass) of the acrylic copolymer (C0).

When the content of the structural unit (c2) is 0.5% by mass or more, the content of the structural unit (c2) having a functional group serving as a reactive site with the polymerizable compound (Xc) can sufficiently be secured, and a pressure sensitive adhesive layer having high curability can be formed by energy ray irradiation. Therefore, when the pressure sensitive adhesive sheet is laminated to an adherend and then peeled therefrom, the sheet can be peeled while preventing the occurrence of a residue of the pressure sensitive adhesive layer on the adherend. Further, the interfacial adhesion after energy ray irradiation between the pressure sensitive adhesive layer and the intermediate layer to be formed can be improved.

Further, when the content of the structural unit (c2) is 40% by mass or less, sufficient pot life can be secured when the solution of the pressure sensitive adhesive composition is applied to form the pressure sensitive adhesive layer.

The acrylic copolymer (C0) may have a structural unit (c3) derived from another monomer (c3') other than the above monomers (c1') and (c2').

Examples of another monomer (c3') include those illustrated as the monomer (a3') described above.

The content of the structural unit (c3) in the acrylic copolymer (C0) is preferably 0 to 20% by mass, more preferably 0 to 10% by mass, further preferably 0 to 5% by mass, further more preferably 0 to 1% by mass, based on the total structural units (100% by mass) of the acrylic copolymer (C0).

Note that each of the monomers (c1') to (c3') described above may be used singly or in combinations of two or more.

Note that the acrylic copolymer (C0) can be synthesized by the same method as that for synthesizing the component (A) and the component (B0) described above.

The energy ray-curable acrylic copolymer (C1) is obtained by the reaction of a polymerizable compound (Xc) with a functional group in the structural unit (c2) of the above acrylic copolymer (C0), wherein the energy ray-polymerizable group in the polymerizable compound (Xc) is introduced into at least one of a main chain and a side chain of the acrylic copolymer (C0).

The same compound as the polymerizable compound (Xb) described above can be used as the polymerizable compound (Xc). Among them, the polymerizable compound (Xc) is preferably a compound having a reactive substituent and 1 to 5 energy ray-polymerizable groups per molecule.

Examples of the above reactive substituent include an isocyanate group, a carboxyl group, and an epoxy group, and an isocyanate group is preferred.

As described above, examples of the above energy ray-polymerizable group include a (meth)acryloyl group and a vinyl group, and a (meth)acryloyl group is preferred.

Specific examples of the polymerizable compound (Xc) include those illustrated as the polymerizable compound (Xb) described above, and (meth)acryloyloxy ethyl isocyanate is preferred.

Note that one polymerizable compound (Xc) may be used alone or in combinations of two or more.

The synthetic method of the acrylic copolymer (C1) is the same as that of the component (B1) described above.

The amount of the polymerizable compound (Xc) blended in the synthesis of the acrylic copolymer (C1) is preferably 10 to 90 equivalents, more preferably 20 to 80 equivalents, further preferably 30 to 70 equivalents, further more preferably 35 to 65 equivalents, based on 100 equivalents of the total number of functional groups in the acrylic copolymer (C0).

In the acrylic copolymer (C1), with respect to the relationship between the number of functional groups in the acrylic copolymer (C0) and the amount of the polymerizable compound (Xc) blended, the value of β calculated from the following formula (2) is preferably 0.5 to 50, more preferably 1.0 to 40, further preferably 1.2 to 35, further more preferably 1.5 to 30, from the point of view of obtaining a pressure sensitive adhesive sheet which has a suitable adhesive strength before energy ray irradiation and in which the adhesive strength can be effectively reduced after energy ray irradiation.

Note that the above value of β corresponds to the number of energy ray-polymerizable groups in the acrylic copolymer (C1).

$$\beta=[P_c]\times[Q_c]\times[R_c]/100 \quad \text{Formula (2)}$$

wherein $[P_c]$ represents the content of the structural unit (c2) based on 100 parts by mass of total structural units of the acrylic copolymer (C0); $[Q_c]$ represents the equivalent of the polymerizable compound (Xc) based on 100 equivalents of functional groups derived from the functional group-containing monomer in the acrylic copolymer (C0); and $[R_c]$ represents the number of the energy ray-polymerizable groups in the polymerizable compound (Xc).

[Cross-Linking Agent]

The pressure sensitive adhesive composition preferably further contains a cross-linking agent.

Examples of the cross-linking agent include those illustrated as a cross-linking agent contained in the intermediate layer-forming composition described above, in which an isocyanate-based cross-linking agent is preferred. Note that one cross-linking agent may be used alone or in combinations of two or more.

The content of the cross-linking agent is preferably 0.01 to 10 parts by mass, more preferably 0.1 to 7 parts by mass, further preferably 0.5 to 4 parts by mass, based on 100 parts by mass of the component (C).

[Photopolymerization Initiator]

The pressure sensitive adhesive composition preferably further contains a photopolymerization initiator.

Examples of the photopolymerization initiator include those illustrated as a photopolymerization initiator contained in the intermediate layer-forming composition described above. Note that one photopolymerization initiator may be used alone or in combinations of two or more.

The content of the photopolymerization initiator is preferably 0.01 to 10 parts by mass, more preferably 0.1 to 7 parts by mass, further preferably 0.5 to 4 parts by mass, based on 100 parts by mass of the component (C).

[Other Additives Contained in Pressure Sensitive Adhesive Composition]

The pressure sensitive adhesive composition may contain other additives in the range that does not impair the effects of the present invention.

Examples of other additives include a tackifier, an anti-oxidant, a softener (plasticizer), a filler, a rust preventive agent, a pigment, and a dye.

When the composition contains these additives, the content of each additive is preferably 0.01 to 6 parts by mass, more preferably 0.01 to 2 parts by mass, based on 100 parts by mass of the component (C).

Further, the pressure sensitive adhesive composition may contain resin components other than the component (C).

Examples of the resin components other than the component (C) include a non-energy ray-curable acrylic polymer, a polyisobutylene-based resin, a urethane-based resin, and a silicone-based resin.

The content of these resin components other than the component (C) is preferably 10% by mass or less, more preferably 5% by mass or less, further preferably 1% by mass or less, based on the total amount (100% by mass) of the pressure sensitive adhesive composition.

Note that the pressure sensitive adhesive composition may further be diluted with an organic solvent into the form of a solution of the pressure sensitive adhesive composition from the point of view of improving coating properties when an intermediate layer is formed on the surface of a base material or a release material.

Examples of the organic solvent include those illustrated as an organic solvent used for diluting the intermediate layer-forming composition described above.

Note that, as the organic solvent to be used, an organic solvent used in the synthesis of the component (C) may be used as it is, or one or more organic solvents other than the organic solvent used in the synthesis may be added thereto.

When the pressure sensitive adhesive composition is converted into the form of a solution, the solid concentration of the solution of the pressure sensitive adhesive composition is preferably 5 to 70% by mass, more preferably 10 to 60% by mass, further preferably 15 to 50% by mass.

<Release Material>

The pressure sensitive adhesive sheet for wafer protection of the present invention may further have a release material on the pressure sensitive adhesive layer.

Examples of the release material include a release sheet subjected to release treatment on both surfaces thereof and a release sheet subjected to release treatment on one surface thereof. Examples of these release sheets include a sheet obtained by coating a base material for release materials with a release agent.

Examples of the base material for release materials include resin films used as the base materials described above, and preferred examples include films based on polyesters such as polyethylene terephthalate, polybutylene terephthalate, and polyethylene naphthalate and films based on polyolefins such as polypropylene and polyethylene.

Examples of the release agent include a silicone-based resin, an olefinic resin, a rubber-based elastomer such as an isoprene-based resin and a butadiene-based resin, a long-chain alkyl-based resin, an alkyd-based resin, and a fluorine-based resin.

The thickness of the release material is, but not particularly limited to, preferably 10 to 200 more preferably 25 to 150 µm.

[Method for Manufacturing Pressure Sensitive Adhesive Sheet for Wafer Protection]

The pressure sensitive adhesive sheet for wafer protection of the present invention can be manufactured by, but not particularly limited to, a known method.

For example, the pressure sensitive adhesive sheet for wafer protection can be manufactured by coating a surface of a base material with a solution of the intermediate layer-forming composition described above to form an intermediate layer, separately coating a surface of a release material with a solution of the pressure sensitive adhesive composition described above to form a pressure sensitive adhesive layer, and laminating the intermediate layer and the pressure sensitive adhesive layer formed.

Examples of the method for coating a surface of a base material or a release material with a solution of the intermediate layer-forming composition or a solution of the pressure sensitive adhesive composition include a spin coating method, a spray coating method, a bar coating method, a knife coating method, a roll coating method, a blade coating method, a die coating method, and a gravure coating method.

A specific manufacturing method will be described below. Examples of the method for manufacturing a pressure sensitive adhesive sheet for wafer protection 1b shown in FIG. 1 (b) include a manufacturing method including directly coating one surface of a base material 11 with a solution of an intermediate layer-forming composition followed by drying to form an intermediate layer 12; separately, directly coating a release-treated surface of a release material 14 with a solution of a pressure sensitive adhesive composition followed by drying to form a pressure sensitive adhesive layer 13; and laminating the pressure sensitive adhesive layer 13 and the intermediate layer 12 formed on the base material 11.

Note that a pressure sensitive adhesive sheet for wafer protection 1a shown in FIG. 1 (a) can be manufactured by obtaining the pressure sensitive adhesive sheet for wafer protection 1b and then removing the release material 14.

Further, for forming a thick intermediate layer, a release-treated surface of a release material is directly coated with a solution of an intermediate layer-forming composition followed by drying to form a release material having an intermediate layer; two or more of the release materials each having an intermediate layer are manufactured; and the intermediate layers of the two release materials each having an intermediate layer can be laminated to each other to form a thick intermediate layer.

EXAMPLES

The values measured by the method to be described below were used as the weight average molecular weight (Mw) of the components used and the compounds produced in the following Manufacturing Examples.

<Weight Average Molecular Weight (Mw)>

The mass average molecular weight (Mw) was determined as a mass average molecular weight in terms of standard polystyrene using a gel permeation chromatograph apparatus (product name "HLC-8020" manufactured by Tosoh Corporation) under the following conditions.

(Measurement Conditions)
Column: "TSK guard column HXL-H", "TSK gel GMHXL (X2)", "TSK gel G2000HXL" (all manufactured by Tosoh Corporation)
Column temperature: 40° C.
Developing solvent: tetrahydrofuran
Flow rate: 1.0 mL/min Manufacturing Example 1

Synthesis of Non-Energy Ray-Curable Acrylic Copolymers (A-1) to (A-3)

To an ethyl acetate solvent, were added 90 parts by mass of butyl acrylate (BA) and 10 parts by mass of acrylic acid (AAc), and thereto was added 1.0 part by mass of azobisisobutyronitrile (AIBN) as a polymerization initiator. Then, solution polymerization was progressed to obtain non-energy ray-curable acrylic copolymers (A-1) to (A-3)) (Mw of (A-1): 500,000, Mw of (A-2) 100,000, Mw of (A-3): 1,200,000), respectively. Note that acrylic copolymers each having a desired Mw were obtained by adjusting polymerization time.

Manufacturing Example 2

Synthesis of Energy Ray-Curable Acrylic Copolymers (B-1) to (B-3)

To an ethyl acetate solvent, were added 62 parts by mass of butyl acrylate (BA), 10 parts by mass of methyl methacrylate (MMA), and 28 parts by mass of 2-hydroxyethyl acrylate (HEA), and thereto was added 1.0 part by mass of azobisisobutyronitrile (AIBN) as a polymerization initiator. Then, solution polymerization was progressed for a predetermined period of time to obtain an acrylic copolymer (BA/MMA/HEA=62/10/28 (% by mass)).

Subsequently, methacryloyloxy ethyl isocyanate in such an amount that the number of isocyanate groups is 80 equivalents based on 100 equivalents of the total number of hydroxy groups in HEA added was added to the acrylic copolymer and allowed to react with each other to obtain energy ray-curable acrylic copolymers (B-1) to (B-3) each having an energy ray-polymerizable group in a side chain (Mw of (B-1): 100,000, Mw of (B-2): 600,000, Mw of (B-3): 400,000), respectively. Note that in order to obtain an energy ray-curable acrylic copolymers each having a desired Mw, the mass average molecular weight of the acrylic copolymers was controlled by adjusting the polymerization time of the acrylic copolymers (BA/MMA/HEA). Further, in any of the acrylic copolymers (B-1) to (B-3), the value of α calculated from the above formula (1) is 22.4.

Manufacturing Example 3

(1) Synthesis of Energy Ray-Curable Acrylic Copolymer (C-1)

To an ethyl acetate solvent, were added 74 parts by mass of butyl acrylate (BA), 20 parts by mass of methyl methacrylate (MMA), and 6 parts by mass of 2-hydroxyethyl acrylate (HEA), and thereto was added 1.0 part by mass of azobisisobutyronitrile (AIBN) as a polymerization initiator. Then, solution polymerization was progressed for a predetermined period of time to obtain an acrylic copolymer (BA/MMA/HEA=74/20/6 (% by mass)). Subsequently, methacryloyloxy ethyl isocyanate in such an amount that the number of isocyanate groups is 50 equivalents based on 100 equivalents of the total number of hydroxy groups in 2-hydroxyethyl acrylate (HEA) added was added to the acrylic copolymer and allowed to react with each other to obtain an energy ray-curable acrylic copolymer (C-1) having an energy ray-polymerizable group in a side chain (Mw: 600,000). Note that, in the acrylic copolymer (C-1), the value of β calculated from the above formula (2) is 3.

(2) Preparation of Release Sheet Having Pressure Sensitive Adhesive Layer

The energy ray-curable acrylic copolymer (C-1) was blended with 0.5 part by mass of a tolylene diisocyanate-based cross-linking agent (trade name "BHS 8515", manufactured by TOYOCHEM Co., Ltd.) and 3.9 parts by mass of 1-hydroxy-cyclohexyl-phenyl-ketone (trade name "IRGACURE 184", manufactured by BASF A.G.) as a photopolymerization initiator based on 100 parts by mass of the solid content of the energy ray-curable acrylic copolymer (C-1) and diluted with ethyl acetate to prepare a solution of a pressure sensitive adhesive composition having a solid concentration of 35% by mass.

Then, a release-treated surface of a release sheet (trade name "SP-PET381031", a polyethylene terephthalate film subjected to silicone release treatment, manufactured by Lintec Corporation) was coated with a solution of the pressure sensitive adhesive composition prepared so that the thickness after drying might be 20 μm, thus forming a coating film. Next, the coating film was dried for 1.5 minutes at 100° C. to form a pressure sensitive adhesive layer, thus obtaining a release sheet having a pressure sensitive adhesive layer.

Examples 1 to 4, Comparative Examples 1 to 8

(1) Preparation of Intermediate Layer-Forming Composition

The non-energy ray-curable acrylic copolymers, the energy ray-curable compounds, the cross-linking agent, and the photopolymerization initiator of the types and amounts blended (solid content ratio) shown in Table 1 were added and diluted with ethyl acetate to prepare solutions of intermediate layer-forming compositions each having a solid concentration of 35% by mass.

The details of each component used for preparing the intermediate layer-forming compositions described in Table 1 are shown below.

<Non-Energy Ray-Curable Acrylic Copolymer>
  "A-1": the non-energy ray-curable acrylic copolymer (A-1) obtained in Manufacturing Example 1, Mw=500,000.
  "A-2": the non-energy ray-curable acrylic copolymer (A-2) obtained in Manufacturing Example 1, Mw=100,000.
  "A-3": the non-energy ray-curable acrylic copolymer (A-3) obtained in Manufacturing Example 1, Mw=1,200,000.
<Energy Ray-Curable Compound>
  "B-1": the energy ray-curable acrylic copolymer (B-1) obtained in Manufacturing Example 2, Mw=100,000.
  "B-2": the energy ray-curable acrylic copolymer (B-2) obtained in Manufacturing Example 2, Mw=600,000.
  "B-3": the energy ray-curable acrylic copolymer (B-3) obtained in Manufacturing Example 2, Mw=400,000.
  "14-29B" (trade name, manufactured by Dainichiseika Color & Chemicals Mfg. Co., Ltd.): penta- to nonafunctional pentaerythritol-based urethane acrylate, Mw=2300, the ratio of Mw/the number of energy ray-curable groups=328 to 460, solid concentration: 80% by mass.
<Cross-Linking Agent>
  "BHS 8515" (trade name, manufactured by TOYOCHEM Co., Ltd.): tolylene diisocyanate-based cross-linking agent.
<Photopolymerization Initiator>
  "IRGACURE 184" (trade name, manufactured by BASF A.G.): 1-hydroxy-cyclohexyl-phenyl-ketone.

(2) Preparation of Pressure Sensitive Adhesive Sheet for Wafer Protection

A release-treated surface of a release sheet (trade name "SP-PET381031", a polyethylene terephthalate film subjected to silicone release treatment, thickness: 38 μm, manufactured by Lintec Corporation) was coated with a solution of an intermediate layer-forming composition prepared as described above so that the thickness after drying might be 45 μm, thus forming a coating film. Next, the coating film was dried for 2 minutes at 100° C. to form an intermediate layer, to prepare a release sheet having an intermediate layer.

Note that two of the same release sheet having an intermediate layer were prepared, and the intermediate layers of the two release sheets each having an intermediate layer were laminated to each other to obtain a laminated sheet in which an intermediate layer having a thickness of 90 μm was sandwiched by two release sheets.

Then, one of the release sheets of the laminated sheet was removed, and an ethylene-vinylacetate copolymer (EVA) film (thickness: 120 μm) was laminated, as a base material, on the surface of the exposed intermediate layer as a base material.

Further, the other of the release sheets was also removed, and the pressure sensitive adhesive layer of the release sheet having a pressure sensitive adhesive layer prepared in Manufacturing Example 3 was laminated on the surface of the exposed intermediate layer to obtain a pressure sensitive adhesive sheet for wafer protection comprising a base material (120 μm)/an intermediate layer (90 μm)/a pressure sensitive adhesive layer (20 μm)/a release sheet (38 μm) as shown in FIG. 1 (b).

Note that, in Comparative Example 7, the film formability of the intermediate layer-forming composition prepared was poor, and when a release sheet was removed from the release sheet in the above preparation process, a part of the intermediate layer was deposited on the release sheet, and it was impossible to prepare a pressure sensitive adhesive sheet for wafer protection.

The pressure sensitive adhesive sheets for wafer protection prepared in Examples and Comparative Examples were evaluated for "interfacial adhesion" and "followability to unevenness" based on the following methods. The results are shown in Table 1.

Further, the pressure sensitive adhesive sheets for wafer protection prepared in Examples 1 to 4 and Comparative Example 8 were evaluated for "stability with time" based on the following method. The results are shown in Table 2.

<Interfacial Adhesion>

The pressure sensitive adhesive sheets for wafer protection prepared in Examples and Comparative Examples were irradiated with ultraviolet rays having a quantity of light of 500 mJ/cm$^2$ to cure the pressure sensitive adhesive layers.

Next, a release sheet of the pressure sensitive adhesive sheet was removed, and the cut of 11 longitudinal lines×11 lateral lines was created on the cured pressure sensitive adhesive layer at a spacing of 5 mm to form a cross-cut (the number of cells: 100). Note that the depth of the cut was adjusted so that it is a depth that completely cuts the pressure sensitive adhesive layer (20 μm) but does not deeply cut the intermediate layer (90 μm) (specifically 20 μm or more and less than 110 μm).

Then, a cellophane pressure sensitive adhesive tape (trade name "Sellotape (registered trademark)", manufactured by Nichiban Co., Ltd.) was laminated on the surface of the pressure sensitive adhesive layer and allowed to stand for 20 minutes at 23° C. and 50% RH (relative humidity). Subsequently, the pressure sensitive adhesive sheet for wafer protection was pressed with one hand, and an end of the above cellophane pressure sensitive adhesive tape was held with the other hand. The cellophane pressure sensitive adhesive tape was then pulled in a direction perpendicular to the pressure sensitive adhesive sheet for wafer protection and instantaneously peeled from the surface of the pressure sensitive adhesive layer.

After peeling the cellophane pressure sensitive adhesive tape, the cross-cut on the pressure sensitive adhesive layer of the pressure sensitive adhesive sheet for wafer protection was visually checked, and the number of cells in which delamination between the pressure sensitive adhesive layer and the intermediate layer was observed was counted to evaluate the interfacial adhesion between the intermediate layer and the pressure sensitive adhesive layer of the pressure sensitive adhesive sheet for wafer protection after ultraviolet irradiation. Table 1 shows the number of cells in which delamination between the intermediate layer and the pressure sensitive adhesive layer was observed in 100 cells. It can be said that the smaller the number of cells described in Table 1, the better the interfacial adhesion between the intermediate layer and the pressure sensitive adhesive layer of the pressure sensitive adhesive sheet for wafer protection after ultraviolet irradiation.

<Followability to Unevenness>

Pressure sensitive adhesive sheets for wafer protection prepared in Examples and Comparative Examples described above were each laminated, through a pressure sensitive adhesive layer which was exposed by removing a release sheet of the pressure sensitive adhesive sheet for wafer protection, to the surface of a bump wafer on which projections (bumps) were formed (bump diameter: 100 μm, bump pitch: 200 μm, bump height: 80 μm) at a laminating temperature of 60° C. and a laminating speed of 20 mm/s using an apparatus for laminating a pressure sensitive adhesive sheet for wafer protection (product name "RAD-3510", manufactured by Lintec Corporation).

Then, the diameters of five air bubble around projections (bumps) of the bump wafer after the pressure sensitive adhesive sheet was laminated were measured with an optical microscope, and the average value of the diameters of air bubbles was calculated. The followability to unevenness of the pressure sensitive adhesive sheet for wafer protection was evaluated based on the following criteria.

A: The diameter of air bubbles was less than 162 μm.

B: The diameter of air bubbles was 162 μm or more and less than 165 μm.

C: The diameter of air bubble was 165 μm or more.

<Stability with Time>

The pressure sensitive adhesive sheets for wafer protection prepared in Examples 1 to 4 and Comparative Example 8 were stored for "one month at 23° C." and "one month at 40° C.", respectively.

Then, the adhesive strengths before and after ultraviolet ray (UV) irradiation of each pressure sensitive adhesive sheet for wafer protection before storage, after being stored for one month at 23° C., and after being storing for one month at 40° C. were measured based on the following methods.

(Method for Measuring Adhesive Strength of Pressure Sensitive Adhesive Sheet)

A pressure sensitive adhesive sheet for wafer protection in which a release sheet was removed to expose a pressure sensitive adhesive layer was laminated to the mirror finished surface of a semiconductor wafer by reciprocating a rubber roller having a weight of 2 kg in an environment of 23° C. and 65% RH (relative humidity) and allowed to stand for 20 minutes.

Subsequently, the 180° peel adhesive strength (mN/25 mm) before UV irradiation was measured at a peel speed of 300 mm/min using a universal tensile testing machine (product name "TENSILON/UTM-4-100", manufactured by Orientec Co., Ltd.).

Further, the pressure sensitive adhesive sheet for wafer protection after being laminated to a semiconductor wafer and allowed to stand in the same manner as described above was irradiated with ultraviolet rays from the base material side using an ultraviolet irradiation apparatus (product name "RAD-2000", manufactured by Lintec Corporation) (quantity of light: 500 mJ/cm$^2$, illuminance: 220 mW/cm$^2$, irradiation speed: 15 mm/s). Then, the peel adhesive strength (mN/25 mm) after UV irradiation was measured under the same conditions as described above.

Table 2 shows the results of the measurement of the peel adhesive strength of the pressure sensitive adhesive sheets before and after UV irradiation stored for one month at 23° C. or 40° C.

Further, the rate of change of adhesive strength with time of the pressure sensitive adhesive sheets for wafer protection before and after UV irradiation was calculated from the following formula.

$$[\text{The rate of change of adhesive strength (\%)}] = |X_0 - X|/X_0 \times 100$$

($X_0$: Adhesive strength of the pressure sensitive adhesive sheet for wafer protection before storage)

X: Adhesive strength of the pressure sensitive adhesive sheet for wafer protection after "being stored for one month at 23° C." or "being stored for one month at 40° C."

Then, the stability with time of the pressure sensitive adhesive sheets for wafer protection was evaluated by the values of the calculated rate of change of adhesive strength in accordance with the following criteria.

A: The values of the rate of change of adhesive strength are less than 10% in all the conditions.

F: The values of the rate of change of adhesive strength are 10% or more in any of the conditions.

TABLE 1

| | Intermediate layer-forming composition | | | | | |
|---|---|---|---|---|---|---|
| | Non-energy ray-curable acrylic copolymer | | | Energy ray-curable compound | | |
| | Type | Mw | Amount blended (*1) (parts by mass) | Type | Mw | Amount blended (*1) (parts by mass) |
| Example 1 | A-1 | 500,000 | 100 | B-1 | 100,000 | 68 |
| Example 2 | A-1 | 500,000 | 100 | B-1 | 100,000 | 110 |
| Example 3 | A-2 | 500,000 | 100 | B-1 | 100,000 | 40 |
| Example 4 | A-3 | 1,200,000 | 100 | B-1 | 100,000 | 110 |
| Comparative Example 1 | A-1 | 500,000 | 100 | — | — | — |
| Comparative Example 2 | — | — | — | B-2 | 600,000 | 100 |
| Comparative Example 3 | — | — | — | B-3 | 400,000 | 100 |
| Comparative Example 4 | A-1 | 500,000 | 100 | B-2 | 600,000 | 53 |
| Comparative Example 5 | A-1 | 500,000 | 100 | B-1 | 100,000 | 14 |
| Comparative Example 6 | A-2 | 100,000 | 100 | B-2 | 600,000 | 68 |
| Comparative Example 7 | — | — | — | B-1 | 100,000 | 100 |
| Comparative Example 8 | A-1 | 500,000 | 100 | 14-29B | 2,300 | 32 |

| | Intermediate layer-forming composition | | Evaluation items | |
|---|---|---|---|---|
| | Cross-linking agent BHS 8515 | Photopolymerization initiator IRGACURE 184 | | |
| | Amount blended (*1) (parts by mass) | Amount blended (*1) (parts by mass) | Interfacial adhesion | Followability to unevenness |
| Example 1 | 2.8 | 2.7 | 0 | A |
| Example 2 | 3.1 | 4.3 | 0 | A |
| Example 3 | 2.6 | 1.6 | 0 | A |
| Example 4 | 3.1 | 4.3 | 0 | A |
| Comparative Example 1 | 2.3 | — | 49 | C |
| Comparative Example 2 | 0.8 | 3.9 | 0 | C |
| Comparative Example 3 | 0.8 | 3.9 | 0 | C |
| Comparative Example 4 | 2.8 | 2.1 | 54 | C |
| Comparative Example 5 | 2.4 | 0.6 | 49 | B |
| Comparative Example 6 | 2.8 | 2.7 | 67 | A |
| Comparative Example 7 | 0.8 | 3.9 | (*) | (*) |
| Comparative Example 8 | 0.4 | 1.0 | 0 | A |

(*1): Solid content ratio
(*): Since film formability was poor and it was unable to form an intermediate layer, "interfacial adhesion" and "followability to unevenness" were not evaluated.

TABLE 2

| | Before UV irradiation | | | | | After UV irradiation |
|---|---|---|---|---|---|---|
| | | After being stored for one month at 23° C. | | After being stored for one month at 40° C. | | |
| | Before storage Adhesive strength (mN/25 mm) | Adhesive strength (mN/25 mm) | Amount of change of adhesive strength (%) | Adhesive strength (mN/25 mm) | Amount of change of adhesive strength (%) | Before storage Adhesive strength (mN/25 mm) |
| Example 1 | 9600 | 9750 | 1.6 | 9300 | 3.1 | 1410 |
| Example 2 | 10100 | 10230 | 1.3 | 9900 | 2.0 | 1120 |
| Example 3 | 9500 | 9770 | 2.8 | 9250 | 2.6 | 1240 |
| Example 4 | 11000 | 11200 | 1.8 | 10700 | 2.7 | 1280 |

TABLE 2-continued

| | | | | | |
|---|---|---|---|---|---|
| Comparative Example 8 | 9040 | 6500 | 28.1 | 11700 | 29.4 | 435 |

| | After UV irradiation | | | | |
|---|---|---|---|---|---|
| | After being stored for one month at 23° C. | | After being stored for one month at 40° C. | | |
| | Adhesive strength (mN/25 mm) | Amount of change of adhesive strength (%) | Adhesive strength (mN/25 mm) | Amount of change of adhesive strength (%) | Stability with time |
| Example 1 | 1390 | 1.4 | 1335 | 5.3 | A |
| Example 2 | 1180 | 5.4 | 1040 | 7.1 | A |
| Example 3 | 1290 | 4.0 | 1120 | 9.7 | A |
| Example 4 | 1320 | 3.1 | 1160 | 9.4 | A |
| Comparative Example 8 | 1090 | 150.6 | 1360 | 212.6 | F |

As shown in Tables 1 and 2, it resulted that the pressure sensitive adhesive sheets for wafer protection prepared in Examples 1 to 4 were excellent in all of the interfacial adhesion between the intermediate layer and the pressure sensitive adhesive layer after UV irradiation, the followability to unevenness, and the stability with time.

On the other hand, it resulted that the pressure sensitive adhesive sheets for wafer protection prepared in Comparative Examples 1 and 4 to 6 were poor in the interfacial adhesion between the intermediate layer and the pressure sensitive adhesive layer after UV irradiation, and the pressure sensitive adhesive sheets for wafer protection prepared in Comparative Examples 1 to 4 were poor in the followability to unevenness.

Further, it resulted that the pressure sensitive adhesive sheet for wafer protection prepared in Comparative Example 8 was satisfactory in the interfacial adhesion between the intermediate layer and the pressure sensitive adhesive layer after UV irradiation and the followability to unevenness, but as shown in Table 2, the amount of change of adhesive strength when stored for a long period of time in different environments was large, and the stability with time was poor.

Note that, in Comparative Example 7, the film formability of the intermediate layer-forming composition prepared was poor, and the pressure sensitive adhesive sheet for wafer protection could not be prepared. Therefore, "interfacial adhesion" and "followability to unevenness" were not evaluated.

INDUSTRIAL APPLICABILITY

The pressure sensitive adhesive sheet for wafer protection of the present invention can be suitably used in the application of a back grinding tape to be laminated to a circuit pattern-forming surface of a semiconductor wafer in order to protect the circuit pattern-forming surface during polishing and grinding work or a dicing step of the semiconductor wafer.

REFERENCE SIGNS LIST 1a, 1b Pressure sensitive adhesive sheet for wafer protection
11 Base material
12 Intermediate layer
13 Pressure sensitive adhesive layer
14 Release material

What is claimed is:

1. A pressure sensitive adhesive sheet for wafer protection comprising a base material, an intermediate layer, and a pressure sensitive adhesive layer in this order, wherein
the intermediate layer is a layer formed from an intermediate layer-forming composition comprising 100 parts by mass of a non-energy ray-curable acrylic polymer (A) and 25 parts by mass or more of an energy ray-curable acrylic polymer (B) having a mass average molecular weight of 50,000 to 250,000; and
the pressure sensitive adhesive layer is a layer formed from a pressure sensitive adhesive composition comprising an energy ray-curable acrylic polymer (C).

2. The pressure sensitive adhesive sheet for wafer protection according to claim 1, wherein the mass average molecular weight of the non-energy ray-curable acrylic polymer (A) is 300,000 to 1,500,000.

3. The pressure sensitive adhesive sheet for wafer protection according to claim 1, wherein the content of the energy ray-curable acrylic polymer (B) in the intermediate layer-forming composition is 37 parts by mass or more and 150 parts by mass or less based on 100 parts by mass of the non-energy ray-curable acrylic polymer (A).

4. The pressure sensitive adhesive sheet for wafer protection according to claim 1, wherein the non-energy ray-curable acrylic polymer (A) is an acrylic copolymer (A1) having a structural unit (a1) derived from an alkyl (meth)acrylate monomer (a1') having an alkyl group having 1 to 18 carbon atoms and a structural unit (a2) derived from a functional group-containing monomer (a2').

5. The pressure sensitive adhesive sheet for wafer protection according to claim 1, wherein the energy ray-curable acrylic polymer (B) comprises an energy ray-curable acrylic copolymer (B1) obtained by reacting a polymerizable compound (Xb) with an acrylic copolymer (B0) having a structural unit (b1) derived from an alkyl(meth)acrylate monomer (b1') having an alkyl group having 1 to 18 carbon atoms and a structural unit (b2) derived from a functional group-containing monomer (b2').

6. The pressure sensitive adhesive sheet for wafer protection according to claim 1, wherein the component (C) is an energy ray-curable acrylic copolymer (C1) obtained by reacting a polymerizable compound (Xc) with an acrylic copolymer (C0) having a structural unit (c1) derived from an alkyl(meth)acrylate monomer (c1') having an alkyl group having 1 to 18 carbon atoms and a structural unit (c2) derived from a functional group-containing monomer (c2').

7. The pressure sensitive adhesive sheet for wafer protection according to claim 1, wherein the mass average molecular weight of the non-energy ray-curable acrylic polymer (A) is 300,000 to 1,500,000.

8. The pressure sensitive adhesive sheet for wafer protection according to claim 1, wherein the total content of the non-energy ray-curable acrylic polymer (A) and the energy ray-curable acrylic polymer (B) in the intermediate-layer forming-composition is 70% by mass or more.

9. The pressure sensitive adhesive sheet for wafer protection according to claim 4, wherein the content of the acrylic copolymer (A1) is 70 to 100% by mass based on the total amount of the non-energy ray-curable acrylic polymer (A).

10. The pressure sensitive adhesive sheet for wafer protection according to claim 4, wherein the content of the structural unit (a1) in the acrylic copolymer (A1) is 70 to 95% by mass based on the total structural units of the acrylic copolymer (A1).

11. The pressure sensitive adhesive sheet for wafer protection according to claim 4, wherein the content of the structural unit (a2) in the acrylic copolymer (A1) is 5 to 30% by mass based on the total mass of the structural units of the acrylic copolymer (A1).

12. The pressure sensitive adhesive sheet for wafer protection according to claim 4, wherein the functional group-containing monomer (a2') is a carboxyl group-containing monomer.

13. The pressure sensitive adhesive sheet for wafer protection according to claim 1, wherein the mass average molecular weight of the energy ray-curable acrylic polymer (B) is 60,000 to 220,000.

14. The pressure sensitive adhesive sheet for wafer protection according to claim 5, wherein the content of the acrylic copolymer (B1) is 70 to 100% by mass based on the total amount of the energy ray-curable acrylic polymer (B).

15. The pressure sensitive adhesive sheet for wafer protection according to claim 5, wherein the functional group-containing monomer (b2') is a hydroxyl group-containing monomer.

16. The pressure sensitive adhesive sheet for wafer protection according to claim 5, wherein the polymerizable compound (Xb) has an energy ray-polymerizable group and a substituent that can react with a functional group in the structural unit (b2) of the acrylic copolymer (B0).

17. The pressure sensitive adhesive sheet for wafer protection according to claim 16, wherein the substituent that can react with a functional group in the structural unit (b2) of the acrylic copolymer (B0) is an isocyanate group.

18. The pressure sensitive adhesive sheet for wafer protection according to claim 1, wherein the intermediate layer-forming composition further comprises a cross-linking agent and a photopolymerization initiator.

19. The pressure sensitive adhesive sheet for wafer protection according to claim 1, wherein the pressure sensitive adhesive composition further comprises a cross-linking agent and a photopolymerization initiator.

20. The pressure sensitive adhesive sheet for wafer protection according to claim 4, wherein the alkyl (meth) acrylate monomer (a1') has an alkyl group having 4 to 12 carbon atoms.

* * * * *